US008969803B2

(12) United States Patent
Lordi et al.

(10) Patent No.: US 8,969,803 B2
(45) Date of Patent: Mar. 3, 2015

(54) ROOM TEMPERATURE ALUMINUM ANTIMONIDE RADIATION DETECTOR AND METHODS THEREOF

(75) Inventors: Vincenzo Lordi, Livermore, CA (US); Kuang Jen J. Wu, Cupertino, CA (US); Daniel Aberg, Livermore, CA (US); Paul Erhart, Dublin, CA (US); Arthur W. Coombs, III, Livermore, CA (US); Benjamin W. Sturm, Pleasanton, CA (US)

(73) Assignee: Lawrence Livermore National Security, LLC, Livermore, CA (US)

( * ) Notice: Subject to any disclaimer, the term of this patent is extended or adjusted under 35 U.S.C. 154(b) by 1338 days.

(21) Appl. No.: 12/774,388

(22) Filed: May 5, 2010

(65) Prior Publication Data

US 2011/0147589 A1    Jun. 23, 2011

Related U.S. Application Data

(60) Provisional application No. 61/289,265, filed on Dec. 22, 2009.

(51) Int. Cl.
*G01T 1/00* (2006.01)
*C30B 29/40* (2006.01)
(Continued)

(52) U.S. Cl.
CPC .................. *C30B 29/40* (2013.01); *C30B 11/04* (2013.01); *C30B 15/04* (2013.01); *H01L 21/02549* (2013.01); *H01L 21/02573* (2013.01)
USPC ...................................................... 250/336.1

(58) Field of Classification Search
CPC .. C30B 29/40; C30B 15/00; H01L 21/02549; H01L 21/02398

USPC ........................................................ 250/336.1
See application file for complete search history.

(56) References Cited

U.S. PATENT DOCUMENTS

| 4,668,331 A | * | 5/1987 | Ostriker ............................ 117/8 |
| 6,887,441 B2 | | 5/2005 | Sherohman et al. ............ 423/87 |

(Continued)

FOREIGN PATENT DOCUMENTS

JP          2000281491 A   * 10/2000

OTHER PUBLICATIONS

Restriction/Election Requirement from U.S. Appl. No. 12/976,994 dated Mar. 23, 2012.

(Continued)

*Primary Examiner* — Marcus Taningco
(74) *Attorney, Agent, or Firm* — Zilka Kotab

(57) ABSTRACT

In one embodiment, a method for producing a high-purity single crystal of aluminum antimonide (AlSb) includes providing a growing environment with which to grow a crystal, growing a single crystal of AlSb in the growing environment which comprises hydrogen ($H_2$) gas to reduce oxide formation and subsequent incorporation of oxygen impurities in the crystal, and adding a controlled amount of at least one impurity to the growing environment to effectively incorporate at least one dopant into the crystal. In another embodiment, a high energy radiation detector includes a single high-purity crystal of AlSb, a supporting structure for the crystal, and logic for interpreting signals obtained from the crystal which is operable as a radiation detector at a temperature of about 25° C. In one embodiment, a high-purity single crystal of AlSb includes AlSb and at least one dopant selected from a group consisting of selenium (Se), tellurium (Te), and tin (Sn).

32 Claims, 3 Drawing Sheets

(51) Int. Cl.
*C30B 11/04* (2006.01)
*C30B 15/04* (2006.01)
*H01L 21/02* (2006.01)

(56) References Cited

U.S. PATENT DOCUMENTS

| | | | |
|---|---|---|---|
| 7,224,041 B1 | 5/2007 | Sherohman et al. | |
| 7,309,393 B2 | 12/2007 | Sherohman et al. | 117/13 |
| 2005/0098096 A1 | 5/2005 | Sherohman et al. | 117/201 |
| 2006/0054863 A1* | 3/2006 | Dai et al. | 252/301.4 R |
| 2007/0137700 A1 | 6/2007 | Sherohman et al. | 136/262 |
| 2007/0280409 A1* | 12/2007 | Konno | 378/19 |
| 2008/0073641 A1 | 3/2008 | Cheng et al. | |
| 2011/0084233 A1* | 4/2011 | Von Saldern et al. | 252/301.4 H |

OTHER PUBLICATIONS

Non-Final Office Action Summary from U.S. Appl. No. 12/976,994 dated May 8, 2012.
Notice of Allowance and Fee(s) Due from U.S. Appl. No. 12/976,994 dated Aug. 24, 2012.
Shibata et al., "A Rutherford Backscattering Spectroscopic Study of the Aluminum Antimonide Oxidation Process in Air," Japan Journal of Applied Physics, vol. 33, Part 1, No. 4A, Apr. 1994, pp. 1767-1772.
Nakata et al., "Suppression of AlSb Oxidation With Hydrocarbon Passivation Layer Induced by MeV—He+ Irradiation," Journal of Applied Physics, vol. 76, No. 4, Aug. 15, 1994, pp. 2078-2085.
Blum et al., "Wet Thermal Oxidation of AlAsSb Lattice Matched to InP for Optoelectronic Applications," Journal of Applied Physics Letter, vol. 68, No. 22, May 27, 1996, pp. 3129-3131.
Legay et al., "Wet Thermal Oxidation of AlAsSb Alloys Lattice Matched to InP," Journal of Applied Physics, vol. 81, No. 11, France, Jun. 1, 1997, pp. 7600-7603.
Salesse et al., "Wet Oxidation of AlAsSb Alloys Catalyzed by Methanol," 2002 Elsevier Science B.V., Applied Surface Science, vol. 161, pp. 426-433.
Yee et al., "AlSb as a High-Energy Photon Detector," IEEE Transactions on Nuclear Science, vol. 24, No. 4, Nov. 8, 1976, pp. 1962-1967.
Erhart et al., "Extrinsic point defects in aluminum antimonide," May 25, 2010, pp. 1-13.
Erhart et al., "Theory-Guided Development of Semiconductors with Optimum Transport Properties," Oct. 5, 2010, pp. 1-5.
Lordi et al., "Charge Carrier Scattering by Defects in Semiconductors," Jun. 4, 2010, pp. 1-6.
J.H. Yee et al., "AiSb as a High-Energy Photon Detector," IEEE Transactions on Nuclear Science, vol. 24, No. 4, pp. 1962-1967, (1977).

* cited by examiner

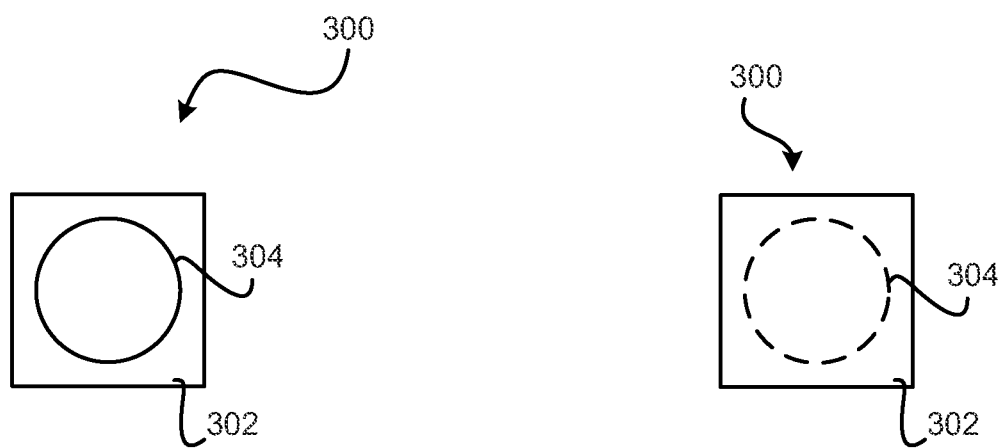
FIG. 3A
FIG. 3B
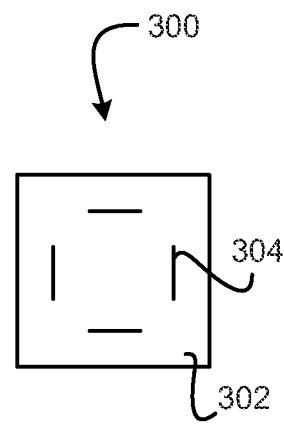
FIG. 3C

US 8,969,803 B2

ROOM TEMPERATURE ALUMINUM ANTIMONIDE RADIATION DETECTOR AND METHODS THEREOF

RELATED APPLICATIONS

This application claims priority to Provisional U.S. Appl. No. 61/289,265 filed on Dec. 22, 2009, which is herein incorporated by reference.

The United States Government has rights in this invention pursuant to Contract No. DE-AC52-07NA27344 between the United States Department of Energy and Lawrence Livermore National Security, LLC for the operation of Lawrence Livermore National Laboratory.

FIELD OF THE INVENTION

The present invention relates to high energy (ionizing) radiation detection, and more particularly, to systems and methods for fabricating and using large single crystal samples of aluminum antimonide as radiation detectors at room temperature.

BACKGROUND

In the field of high energy (ionizing) radiation detection that operates at near-ambient temperatures with high spectroscopic energy resolution, detectors have a variety of uses, one of which is the field of nuclear nonproliferation and interdiction applications where high sensitivity, high energy resolution, and field capability are very important.

Various semiconductor materials have been investigated for use in the past to try to achieve high-resolution room temperature detectors, including most notably cadmium zinc telluride (CdZnTe) and cadmium telluride (CdTe); however, currently, no attempts have produced samples having all the characteristics desirable of large, single crystal detector materials, whether related to a lack in performance (resolution, absorption, size, etc.), and/or cost (for example, some crystal samples may cost $25,000 to $125,000 per crystal), etc. Specific performance criteria related to effective radiation detector crystals are described in more detail in the Detailed Description section. Efforts to find and fabricate new semiconductor materials to mitigate these issues are currently underway in a number of laboratories. However, to date, no material has been found which can produce the desired characteristics at room temperature.

Aluminum antimonide (AlSb) nominally meets the characteristics desirable of a single crystal detector material, including low-cost and high performance radiation detection at room temperature. A number of past efforts (of very limited success) have been aimed at producing this material in a form appropriate for radiation detection. However, the past efforts have had only limited success due to the lack of existing processes to create large single crystals with all of the below described properties, simultaneously. Particularly, achieving high resistivity with high carrier mobilities has not been possible with conventional production techniques. Consequently, no prior work has been able to demonstrate spectroscopic radiation detection of this material. Various past efforts included growth and annealing steps to produce AlSb material, but failed to control or understand the processes appropriately to produce material with the desired properties for use in radiation detection. Therefore, it would be beneficial to have a process of fabrication and use of AlSb which addresses the shortfalls currently encountered in conventional fabrication techniques.

SUMMARY

In one embodiment, a method for producing a high-purity single crystal of aluminum antimonids (AlSb) includes providing a growing environment with which to grow a crystal, growing a single crystal of AlSb in the growing environment which comprises hydrogen ($H_2$) gas to reduce oxide formation and subsequent incorporation of oxygen impurities in the crystal, and adding a controlled amount of at least one impurity to the growing environment to effectively incorporate at least one dopant into the crystal.

In another embodiment, a high energy radiation detector includes a single high-purity crystal of AlSb, a supporting structure for the crystal, and logic for interpreting signals obtained from the crystal which is operable as a radiation detector at a temperature of about 25° C.

According to another embodiment, a high-purity single crystal of AlSb includes AlSb and at least one dopant selected from a group consisting of selenium (Se), tellurium (Te), and tin (Sn).

In another embodiment, a method for producing a crystalline material includes receiving test results from testing performed on a crystalline material derived from a process, identifying impurities in the crystalline material, determining electronic properties of the identified impurities, identifying one or more identified impurities that are most detrimental to one or more desired material characteristics, and modifying the process to minimize incorporation of the one or more most detrimental impurities into the crystalline material.

Other aspects and embodiments of the present invention will become apparent from the following detailed description, which, when taken in conjunction with the drawings, illustrate by way of example the principles of the invention.

BRIEF DESCRIPTION OF THE DRAWINGS

FIGS. 3A-3C depict several schematic views of a detector crystal having guard ring contacts, according to three illustrative embodiments.

DETAILED DESCRIPTION

Figure 1:
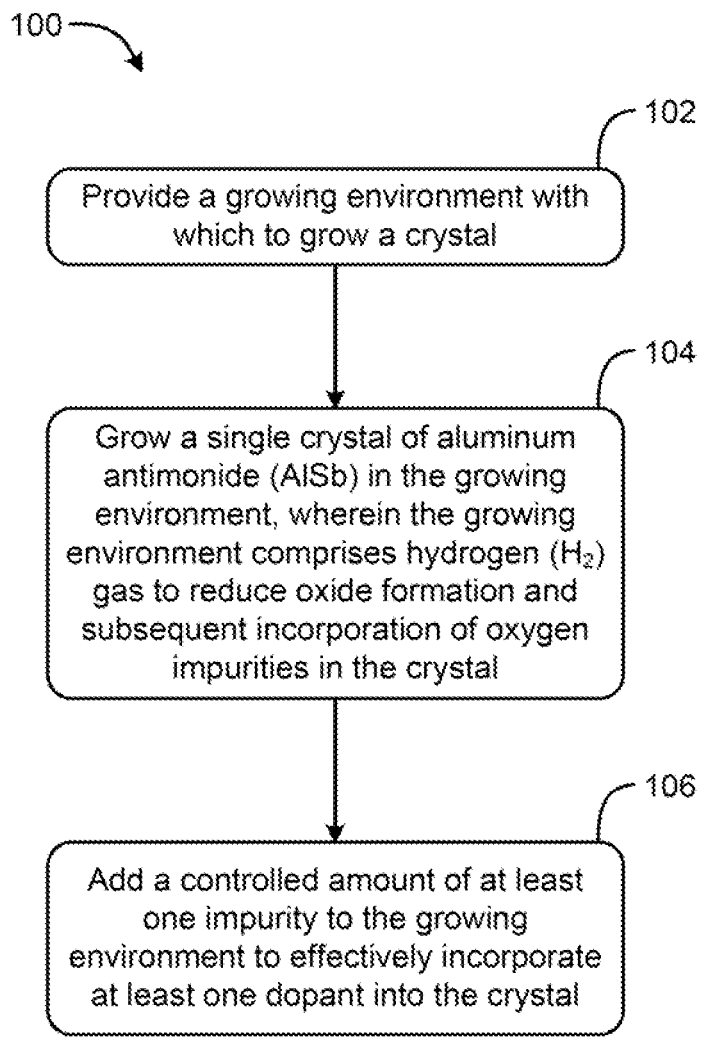
FIG. 1 is a flowchart showing a method according to one embodiment.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified.

Further, it is to be noted that the term "about" as used herein refers to an approximate value. When used in this document, "about" indicates at least ±10% of the value the term precedes. For example, about 5 vol % indicates 5 vol %±0.5 vol %; about 25° C. indicates 25° C.±2.5° C., etc.

In one general embodiment, a method for producing a high-purity single crystal of aluminum antimonide (AlSb)

includes providing a growing environment with which to grow a crystal, growing a single crystal of aluminum antimonide (AlSb) in the growing environment, wherein the growing environment comprises hydrogen ($H_2$) gas to reduce oxide formation and subsequent incorporation of oxygen impurities in the crystal, and adding a controlled amount of at least one impurity to the growing environment to effectively incorporate at least one dopant into the crystal.

In another general embodiment, a high energy radiation detector includes a single high-purity crystal of aluminum antimonide (AlSb), a supporting structure for the crystal, and logic for interpreting signals obtained from the crystal, wherein the crystal is operable as a radiation detector at a temperature of about 25° C.

In another general embodiment, a high-purity single crystal of aluminum antimonide (AlSb) includes aluminum antimonide (AlSb), and at least one dopant selected from a group consisting of selenium (Se), tellurium (Te), and tin (Sn).

A method for producing a crystalline material, in another general embodiment, includes receiving test results from testing performed on a crystalline material derived from a process, identifying impurities in the crystalline material, determining electronic properties of the identified impurities, identifying one or more identified impurities that are most detrimental to one or more desired material characteristics, and modifying the process to minimize incorporation of the one or more most detrimental impurities into the crystalline material.

To achieve a detector with desired performance characteristics (related to radiation detector crystals), several design criteria must be taken into consideration: (i) the material should have a band gap in a suitable range (between about 1.4 eV and about 2.2 eV) so that thermal generation of carriers is suppressed at room temperature while still allowing a large signal to be generated from incident photons; (ii) the material should have high carrier mobilities (roughly at least about 500 $cm^2/V/s$) and long carrier lifetimes (perhaps much greater than about 1 µs) to maximize carrier collection efficiency and ensure high energy resolution; (iv) the material should include high atomic number elements (Z>50) to maximize absorption of high energy radiation; and (v) the material should have high resistivity to minimize noise from background currents in the detector.

According to preferred embodiments, a process of fabricating large single crystal samples of AlSb with appropriate properties (as described above) to operate as effective radiation detectors at room temperature are provided. The types of radiation that can be detected include x-rays, gamma rays, alpha particles, etc. While AlSb has been recognized to possess a near-optimal combination of properties for radiation detection, inherent difficulties of the material have made prior attempts to use it for radiation detection unsuccessful using the current art. Particularly, obtaining AlSb material with sufficiently high resistivity, charge carrier mobility, and purity has been elusive.

According to several embodiments, several growth processes to create large high-purity single-crystal boules of aluminum antimonide (AlSb) with simultaneously high resistivity and high carrier mobility, such that spectroscopic detection of high energy radiation is possible are described. These processes are beyond the current state of the art in making and using this material. In some embodiments, this material, when properly grown, may provide for a room temperature radiation detector using AlSb. In addition to the growth process for AlSb (details of which are provided herein), a computational methodology to enable controlled fabrication of semiconductor materials with tailored transport properties is also described, according to some approaches. The computational methodology is an enabling technology to achieving materials sufficient for radiation detection, in one embodiment. The methodology may also be applied to refining materials for, conceivably, any application.

Some features, according to preferred embodiments, which advance the state of the art of semiconductor crystal growth and processing, include, but are not limited to, identification of the set of most detrimental defects and impurities in a given material in terms of the desired properties (for example, identification of impurity atoms that cause the greatest reduction in carrier mobility), growth or process modifications tailored to remove the most detrimental defects (typically based on computational predictions of the effects of defects and routes to eliminate them), introduction of dopants or intentional impurities at a controlled concentration tailored to mitigate the effects of remaining defects and impurities (for example, to achieve high resistivity with concomitant high carrier mobility), and fabrication of device structures with optimal designs taking into consideration the transport properties of the active material.

Specific embodiments directed toward growth of AlSb as a room temperature radiation detection material include, but are not limited to, introduction of hydrogen gas during growth to reduce oxide formation and subsequent incorporation of oxygen impurities in the material (for example, 3% hydrogen, in an inert environment of argon during Czochralski growth), use of highly stable oxide materials for structural elements of the growth apparatus to further reduce oxygen incorporation during growth (for example, alumina crucibles instead of silica crucibles), intentional introduction of co-dopants during the growth to compensate the effects of intrinsic defects and unintentional impurities which are difficult to remove (for example, the controlled introduction of tellurium during the growth to counter the effects of intrinsic defects and carbon impurities, or the use of a tin dopant with controlled annealing, or other elements, such as selenium and others not specifically mentioned here, that also can achieve compensation in the material), the fabrication of detector devices using a guard ring or other advanced electrode structure to minimize noise currents and enable high signal-to-noise detection which are essential to achieve maximum energy resolution (e.g., less than about 1%).

Specifically, introduction of hydrogen gas during crystal growth and the use of intentional co-doping with elements including, but not limited to, tellurium, selenium, and/or tin, are critical to developing large crystals capable of being used as radiation detectors. Furthermore, the use of an optimized detector structure, including guard ring contacts and/or other optimized contact structures and device geometries, are employed to successfully convert AlSb material into an effective detector. Several exemplary embodiments of a detector device 300 comprising a crystal 302 having guard ring contacts 304 are shown in FIGS. 3A-3C. The guard ring contacts 304 may be arranged in any suitable manner, as would be understood by a skilled artisan upon reading the present descriptions.

Referring to FIG. 1, a method 100 for producing high-purity single crystals of aluminum antimonide (AlSb) is shown according to one embodiment. The method may be performed in any desired environment, and may include more operations than are described below.

In operation 102, a growing environment is provided with which to grow a crystal. The growing environment may include a growing apparatus with which a crystal is grown over a period of time. The growing apparatus may be included in a chamber in which the growing conditions may be controlled. For example, some conditions that may be controlled include, but are not limited to temperature, humidity, pressure, gases surrounding the crystal, materials in the growing chamber, etc.

In some embodiments, the growing environment may comprise between about 1 vol % and about 5 vol % hydrogen gas ($H_2$) and at least one inert gas. In a preferred embodiment, the growing environment may comprise about 3 vol % hydrogen gas ($H_2$).

In a further embodiment, the at least one inert gas may be argon (Ar). In other embodiments, the inert gas may be helium (He), neon (Ne), krypton (Kr), xenon (Xe), etc.

In operation 104, a single crystal of aluminum antimonide (AlSb) is grown in the growing environment. The growing environment comprises hydrogen ($H_2$) gas, which has an effect to reduce oxide formation and subsequent incorporation of oxygen impurities in the crystal over the period of time in which the crystal is growing.

In operation 106, a controlled amount of at least one impurity (dopant) is added to the growing environment to effectively incorporate at least one dopant into the crystal.

In some embodiments; the at least one impurity may be selected from a group consisting of selenium (Se), tellurium (Te), and tin (Sn). Of course, any other impurities may be controllably added to the crystal as would be known to one of skill in the art, in order to effect desired characteristics on the AlSb crystal after growth thereof.

In preferred embodiments, the controlled amount of the at least one impurity is selected based on experimental determinations of crystal performance with varying amounts of dopant added to the crystal. For example, after incorporating an amount of dopant into a crystal, the crystal may be tested to determine the effect that the dopant has on the characteristics of the crystal.

In several approaches, the method 100 may further comprise using highly stable oxide materials as structural elements of a growth apparatus in the growing environment to further reduce oxygen incorporation into the crystal during growth of the crystal. For example, one highly stable oxide material is $Al_2O_3$. Any other highly stable oxide material may also be used as would be known to one of skill in the art.

Figure 2:
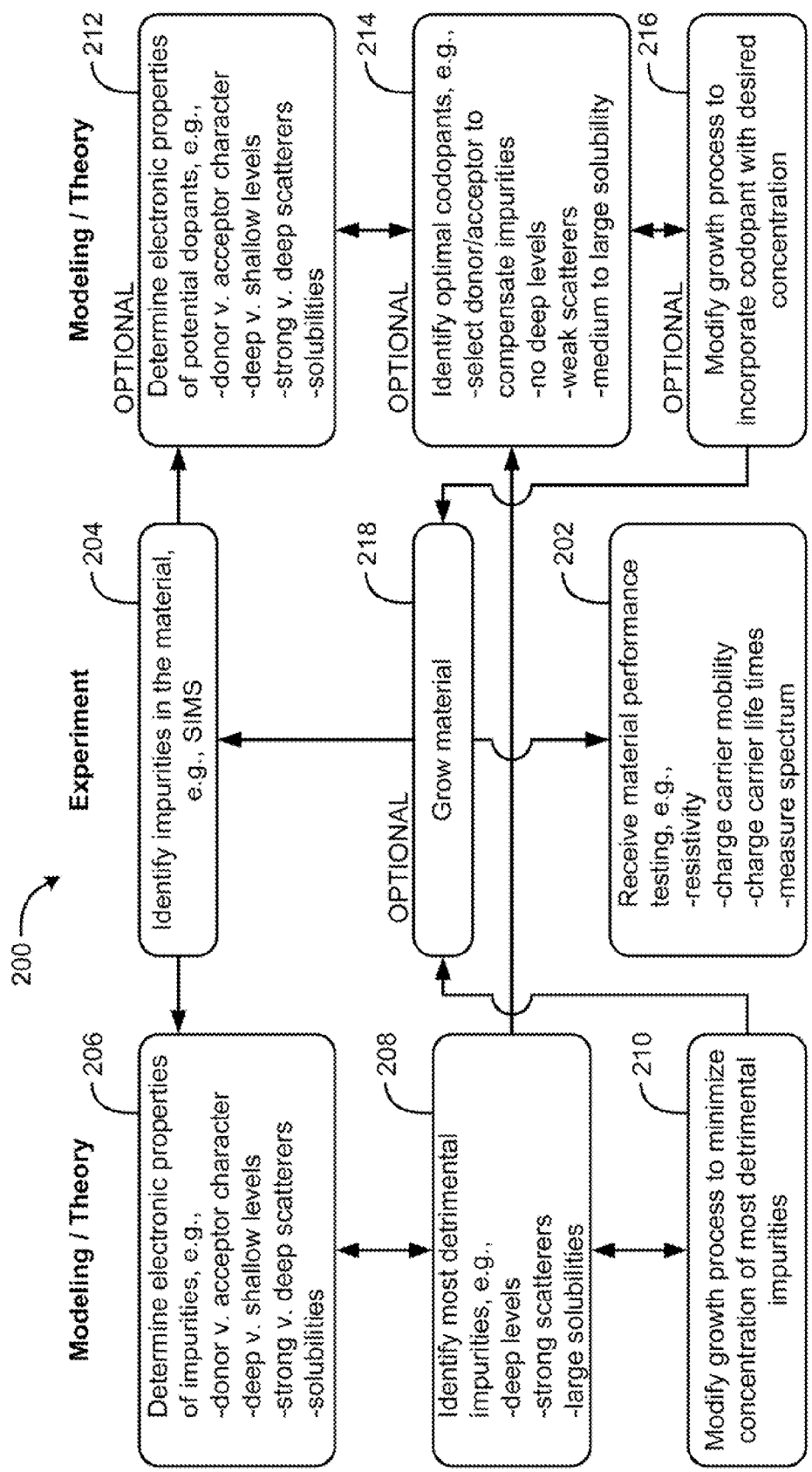
FIG. 2 is a flowchart showing a method according to one embodiment.

Now referring to FIG. 2, a method 200 for producing a material is shown according to one embodiment. The method may be carried out in any desired environment, including being executed using a computer system. The computer system may include a processor and a memory coupled to the processor, the processor being for executing functions stored in the memory coupled thereto. Of course, any computer system may be used with which to execute the method 200 described in FIG. 2.

In operation 202, test results from testing performed on a material derived from a growing process are received. The material may be derived from any growing process, including those described herein and others known to those of skill in the art. Some testing parameters include, but are not limited to: resistivity, charge carrier mobility, charge carrier life times, spectrum measurement, etc.

In addition, the material may have any structure, and in one preferred embodiment, the material may have a crystalline structure.

In operation 204, impurities are identified in the material. Any method and/or system for identifying impurities may be used, such as secondary ion mass spectrometry (SIMS), glow-discharge mass spectrometry (GDMS), a sensitive high resolution ion microprobe (SHRIMP), etc.

In operation 206, electronic properties of the identified impurities are determined. Any method and/or system for determining the electronic properties of the identified impurities may be used as known to those of skill in the art, such as Hall measurement, deep-level transient spectroscopy (DLTS), capacitive-voltage (CV) measurement, photoluminescence (PL), etc. Some potential electronic properties that may be determined include, but are not limited to: donor versus acceptor character of the identified impurities, deep versus shallow levels of the identified impurities, strong versus deep scattering property of the identified impurities, solubility of the identified impurities and any other components, etc.

In operation 208, one or more identified impurities that are most detrimental to one or more desired material characteristics are identified. Any method and/or system for identifying the one or more identified impurities that are most detrimental to one or more desired material characteristics may be used as would be known to one of skill in the art. Some properties that may be examined to determine, detrimental consequences of the impurity being kept in the material include, but are not limited to: deep levels of the identified impurities, strong scattering property of the identified impurities, large solubility of the identified impurities, etc.

In operation 210, the process is modified to minimize incorporation of the one or more most detrimental impurities into the material. For example, if oxide compounds are found to be detrimental to a desired characteristic of the material, then hydrogen gas ($H_2$) may be added to an inert gas environment such that oxide compound formation is minimized.

In optional operation 212 electronic properties of a potential dopant are determined, using any technique known in the art. Some potential properties that may be determined include, but are not limited to: donor versus acceptor character of the dopant, deep versus shallow levels of the dopant, strong versus weak carrier scattering property of the dopant, solubility of the dopant and any other components, etc. The potential dopants may be selected based on observed and/or experimental effects that addition of the dopant may have on the material. Of course, any technique of determining electronic properties of a potential dopant may be used as known by those of skill in the art.

In optional operation 214, an optimal codopant is identified, such that the material may be selectively enhanced by addition of the codopant. Some properties that may be examined in order to select an optimal codopant include, but are not limited to: donor/acceptor selection to compensate for impurities in the material, a lack of deep levels, weak scattering property of the codopant, medium to large solubility of the codopant and any other components, etc. Of course, any technique of choosing a codopant may be used as known by those of skill in the art.

In optional operation 216, the process is modified to incorporate the codopant into the crystal in a desired concentration. In this way, the method 200 of producing a material may be iteratively refined so that an optimal method may be determined through experimental testing and knowledge of dopants and impurities available to those of skill in the art and discovered through testing of the material produced through iterative methods.

In one embodiment, the material may be grown in optional operation 218, such that it may be tested in a plurality of other operations for properties and composition.

In one approach, the material derived from the modified method 200 may be tested, and the testing results may be used to perform the method 200 again to further refine the production of the material.

In another embodiment, a high energy room temperature radiation detector includes a single large high-purity crystal of aluminum antimonide (AlSb) having high resistivity and high carrier mobility, a supporting structure for the crystal, and logic for interpreting signals obtained from the crystal. The AlSb crystal may be produced from any method described herein, or any other method capable of producing a single large AlSb crystal having high resistivity and high carrier mobility that is capable of being used as a radiation detector crystal at room temperature.

For additional details about embodiments possible using the above described detector, refer to the methods and systems disclosed in U.S. Pat. No. 7,309,393, titled "High Resistivity Aluminum Antimonide Radiation Detector" which is hereby incorporated by reference.

In one approach, the crystal may comprise a dopant selected from a group consisting of selenium (Se), tellurium (Te), and tin (Sn). Of course, any other dopant may be added to the crystal as would be known to one of skill in the art, in order to effect desired characteristics on the AlSb crystal. In some approaches, the intentional introduction of co-dopants into the crystal may be used to compensate for the effects of intrinsic defects and unintentional impurities which are difficult to remove from the crystal (for example, a tellurium dopant may counter the effects of intrinsic defects and carbon impurities, or a tin dopant with controlled annealing can achieve compensation in the material, etc.).

In one embodiment, the supporting structure may comprise guard ring contacts to minimize noise currents and enable high signal-to-noise detection to achieve high energy resolution. In one approach, the energy resolution achieved may be less than about 1% at 662 keV, e.g., less than about 6.62 keV. In more embodiments, any other advanced electrode structure may be used as would be known to one of skill in the art.

In another embodiment, a high-purity single crystal of aluminum antimonide (AlSb) comprises aluminum antimonide (AlSb) and a dopant selected from a group consisting of selenium (Se), tellurium (Te), and tin (Sn). Also, the crystal may exhibit characteristics of being grown in an environment comprising hydrogen ($H_2$) gas to reduce oxide formation and subsequent incorporation of oxygen impurities in the crystal.

In one example, single crystals of AlSb were grown. The process that was used to grow these crystals is described herein. Of course, this example may be modified, and steps may be added or subtracted as desired.

First, bulk AlSb single-crystals were grown using the Czochralski method in a sealed system (growing environment). The starting material included pellets of 99.9999% pure antimony (Sb) melted into a solid ingot in a quartz ampoule, and 99.9999% pure aluminum (Al) melted in a $Al_2O_3$ crucible. The molten aluminum (Al) was held for 24 hours to outgas the oxide before introduction of antimony (Sb) into the melt. Single-crystal boules with diameters up to about 13 cm were grown from a seed crystal pulled from the melt at about 1 cm/hr while rotating at about 2 rpm. Growth was performed at about 1330K, with heat provided by a graphite susceptor separated from the $Al_2O_3$ crucible by an about 1 atm continuous flow of argon gas (Ar). Some samples were also subjected to post-growth annealing at about 1200K under antimony (Sb) overpressure for up to 8 days. Large single crystal growths up to about 900 g and about 20 cm³ in volume were achieved using this technique, showing excellent uniformity and few, if any, macroscopic defects.

In another example, bulk single-crystals of AlSb were grown in an environment to reduce oxide formation. In this example, 3 vol % hydrogen gas ($H_2$) was introduced into the growth chamber to reduce oxidation and an $Al_2O_3$ ampoule was used for melting antimony (Sb) to further prevent incorporation of mobility-killing oxygen (O) impurities into the material. Also, tellurium (Te) was incorporated at a concentration of about $10^{17}$ cm$^{-3}$. Without hydrogen gas ($H_2$) and tellurium (Te) codoping, the grown AlSb exhibited resistivity up to about $10^5$ Ωcm with net charge carrier concentrations as low as $10^{13}$ cm$^{-3}$, but a mobility of only about 10 cm²/V/s. Incorporating hydrogen gas ($H_2$) into the growth environment, but without the addition of tellurium (Te) doping, results in high carrier mobilities of up to about 400 cm²/V/s to about 500 cm²/V/s owing to the elimination of oxygen (O) scattering centers, but net carrier concentrations are typically in excess of $10^{15}$ cm$^{-3}$, and resistivities are low at about 10 Ωcm to about 100 Ωcm. With the introduction of both hydrogen gas ($H_2$) and tellurium (Te), a resistivity of about $10^5$ Skin, a mobility in the range of about 150 cm²/V/s to about 300 cm²/V/s, and net charge carrier concentrations below $10^{12}$ cm$^{-3}$ are achieved.

The Te-doped material was fabricated into radiation detector devices which showed high signal-to-noise ratios in α-spectra from a $^{210}$Po source around 5.3 MeV. The devices comprised 1×1×0.15 cm³ polished Te-doped AlSb crystals with a gold (Au) guard ring electrode structure on the front and an indium-gallium (In—Ga) liquid paint as a back electrode. Determination of the electron drift figure of merit $\lambda_c \tau_c$ was performed by measuring the shift of the α-spectrum peak centroid as a function of bias voltage and fitting the data to the Hecht relationship. The value of $\mu_c \tau_c$ equaled about 0.58±0.23×$10^4$ cm²/V for the undoped sample, and was improved to about 1.27±0.63×$10^{-4}$ cm²/V by tellurium (Te) doping.

In some approaches, the AlSb crystals developed with methods disclosed herein may be used to detect x-ray, gamma ray, alpha particle, and/or other ionizing radiation from a source or from background sources. The detection may be performed spectroscopically with high energy resolution, while operating at ambient temperatures. Like similar detectors fabricated from other active materials, the device may be configured to also give spatial resolution. Such detectors find use in medical diagnostics as x-ray detectors, PET detectors, etc., in homeland security and nonproliferation applications as detectors of illicit radiological and nuclear material, in space imaging applications, and other radiation detection and imaging applications including instrument diagnostics, etc. The high energy resolution spectroscopic detection ability at ambient temperatures is particularly suited for use in relatively low-cost field-capable detectors for nuclear nonproliferation and interdiction applications. These devices may be used at ports, airports, shipping yards, etc., to detect the presence of nuclear materials in obscured packaging and/or shipping containers.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A method for producing a high-purity single crystal of aluminum antimonide (AlSb), the method comprising:
providing a growing environment with which to grow a crystal;
growing a single crystal of aluminum antimonide (AlSb) in the growing environment, wherein the growing environment comprises hydrogen ($H_2$) gas to reduce oxide formation and subsequent incorporation of oxygen impurities in the crystal; and adding a controlled amount of at least one impurity to the growing environment to effectively incorporate at least one dopant into the crystal,
wherein the at least one impurity comprises one or more elements selected from tellurium (Te) and tin (Sn).

2. The method of claim 1, wherein the growing environment comprises:
between about 1 vol % and about 5 vol % hydrogen gas ($H_2$); and
at least one inert gas.

3. The method of claim 2, wherein the growing environment comprises about 3 vol % hydrogen gas ($H_2$).

4. The method of claim 2, wherein the at least one inert gas is argon (Ar),

5. The method of claim 1, wherein the controlled amount of the at least one impurity added to the crystal and resulting electronic properties of the dopant incorporated into the crystal are controlled by annealing the crystal.

6. The method of claim 1, wherein the controlled amount of the at least one impurity is determined based on experimental testing of crystal performance with varying amounts of the at least one dopant incorporated into the crystal.

7. The method of claim 1, wherein an effective amount of the at least one dopant is incorporated into the crystal to impart on the crystal an observed carrier mobility of at least about 400 $cm^2/V/s$.

8. The method of claim 1, wherein an effective amount of the at least one dopant is incorporated into the crystal to impart on the crystal a carrier lifetime of greater than about 1 μs.

9. The method of claim 1, further comprising using highly stable oxide materials having standard enthalpy of formation greater than about 1000 kJ/mol as structural elements of a growth apparatus in the growing environment to further reduce oxygen incorporation into the crystal during growth of the crystal.

10. The method of claim 1, wherein the crystal has a volume of at least about 1 $cm^3$.

11. The method of claim 1, wherein the crystal has a volume of at least about 10 $cm^3$.

12. The method of claim 1, wherein the crystal is operable as a radiation detector at a temperature of about 25° C.

13. The method of claim 1, wherein the crystal is grown via a Bridgman-Stockbarger process.

14. A high energy radiation detector, comprising;
a single high-purity crystal of aluminum antimonide (AlSb);
a supporting structure for the crystal; and
logic for interpreting signals obtained from the crystal,
wherein the crystal is operable as a radiation detector at a temperature of about 25°C.
wherein the crystal has a volume of at least about 1 $cm^3$, and
wherein the crystal further comprises at least one dopant comprising an element selected from tellurium (Te) and tin (Sn).

15. The detector of claim 14, wherein the crystal has a volume of at east about 10 $cm^3$.

16. The detector of claim 14, wherein the crystal has a carrier mobility ranging from greater than about 400 $cm^2/V/s$ to about 500 $cm^2/V/s$.

17. The detector of claim 14, wherein the crystal has a band gap in a range of between about 1.4 eV and about 2.2 eV.

18. The detector of claim 14, wherein each dopant is a material selected from a group consisting of tellurium (Te), and tin (Sn).

19. The detector of claim 14, wherein the supporting structure comprises one or more gold (Au) guard ring contacts.

20. The detector of claim 14, wherein the crystal is grown in an environment to reduce oxidation formation, the environment comprising:
between about 1 vol % and about 5 vol % hydrogen gas ($H_2$); and
at least one inert gas.

21. The detector as recited in claim 14, wherein the detector exhibits a net charge carrier concentration less than about $10^{12}$ $cm^{-3}$.

22. The detector as recited in claim 14, further comprising:
a first electrode formed on a first surface of the crystal; and
a second electrode formed on a second surface of the crystal,
wherein the first and second surfaces are opposing faces of the crystal, and
wherein the support structure comprises the first electrode.

23. The detector as recited in claim 22, wherein the support structure comprises one or more guard ring contacts formed into the first electrode.

24. The detector as recited in claim 22, wherein the second electrode is a substantially conformal layer formed directly on the second surface of the crystal.

25. The detector as recited in claim 22, wherein the first electrode comprises gold (Au), 26. The detector as recited in claim 22, wherein the second electrode comprises indium-gallium (In-Ga).

27. A high-purity single crystal of aluminum antimonide (AlSb), the crystal comprising:
aluminum antimonide (AlSb); and
at least one dopant selected from a group consisting of tellurium (Te), and tin (Sn).

28. The crystal of claim 27, wherein en effective amount of the at least one dopant is included in the crystal to impart on the crystal a carrier mobility of at least about 425 $cm^2/V/s$ to about 500 $cm^2/V/s$.

29. The crystal of claim 27, wherein en effective amount of the at least one dopant is included in the crystal to impart on the crystal a carrier lifetime of greater than about 1 μs.

30. The crystal of claim 27, wherein the crystal has a volume of at least about 1 $cm^3$.

31. The crystal of claim 27, wherein the crystal has a volume of at least about 10 $cm^3$.

32. The detector as recited in claim 27, the crystal having opposite first and second surfaces, and the detector further comprising:
a first electrode formed into a support structure on the first surface of the crystal, the first electrode comprising one or more guard ring contacts comprising gold (Au); and
a second electrode formed as a conformal layer on the second surface of the crystal, the second electrode comprising indium-gallium (In-Ga).

* * * * *